(12) United States Patent
Cheng et al.

(10) Patent No.: US 11,600,097 B2
(45) Date of Patent: Mar. 7, 2023

(54) FINGERPRINT SENSING SYSTEM AND OPERATION METHOD THEREOF (71) Applicant: Egis Technology Inc., Taipei (TW)

(72) Inventors: Ming-Yuan Cheng, Taipei (TW); Tang-Hung Po, Taipei (TW); Yu-Hsuan Lin, Taipei (TW)

(73) Assignee: Egis Technology Inc., Hsinchu (TW)

( * ) Notice: Subject to any disclaimer, the term of this patent is extended or adjusted under 35 U.S.C. 154(b) by 154 days.

(21) Appl. No.: 16/935,177

(22) Filed: Jul. 21, 2020

(65) Prior Publication Data
US 2021/0182526 A1    Jun. 17, 2021

Related U.S. Application Data (60) Provisional application No. 62/946,431, filed on Dec. 11, 2019.

(30) Foreign Application Priority Data

Jul. 1, 2020   (CN) .......................... 202010620318.5

(51) Int. Cl.
*G06V 40/13* (2022.01)
*H01L 27/146* (2006.01)

(52) U.S. Cl.
CPC .... *G06V 40/1318* (2022.01); *H01L 27/14623* (2013.01); *H01L 27/14627* (2013.01); *H01L 27/14678* (2013.01)

(58) Field of Classification Search
CPC ............. G06K 9/0004; G06K 9/00046; G06V 40/1318; G06V 40/13; G02B 3/0056; H01L 27/14627; H01L 51/5275
See application file for complete search history.

(56) References Cited

U.S. PATENT DOCUMENTS

| | | | |
|---|---|---|---|
| 7,786,423 B2 | 8/2010 | Hwang | |
| 10,101,851 B2 | 10/2018 | Benkley, III et al. | |
| 2018/0260605 A1* | 9/2018 | Wu | G06V 40/1324 |

(Continued)

FOREIGN PATENT DOCUMENTS

| | | |
|---|---|---|
| CN | 102005459 | 4/2011 |
| CN | 101800233 | 7/2014 |

(Continued)

OTHER PUBLICATIONS

"Office Action of Taiwan Counterpart Application", dated Sep. 14, 2021, p. 1-p. 4.

*Primary Examiner* — Yuzhen Shen
(74) *Attorney, Agent, or Firm* — JCIPRNET (57) ABSTRACT A fingerprint sensing system including a plurality of micro-lenses, a sensor, a shielding structure and a controller is provided. The micro-lenses are arranged in an array. The sensor has a plurality of sensing pixels arranged in an array. The sensor, the shielding structure and the micro-lenses are sequentially arranged along an arrangement direction. The controller is electrically connected to the sensor. A pitch between the micro-lenses is greater than a pitch between the sensing pixels. The controller forms a fingerprint image according to signals of a plurality of output pixels of the sensor, wherein each of the output pixels is one of every at least four of neighboring sensing pixels. An operation method of a fingerprint sensing system is also provided.

20 Claims, 5 Drawing Sheets (56) References Cited

U.S. PATENT DOCUMENTS

2020/0097696 A1* 3/2020 Yao .................... G06V 40/1318
2020/0193138 A1* 6/2020 Li ...................... G06V 40/1394
2020/0226342 A1* 7/2020 Lin ..................... G06V 10/147
2020/0327296 A1* 10/2020 Wu .................... H01L 27/14621
2021/0158069 A1* 5/2021 Kim .................... G06V 10/145

FOREIGN PATENT DOCUMENTS

| | | |
|---|---|---|
| CN | 107004130 | 8/2017 |
| TW | M572986 | 1/2019 |
| TW | I652626 | 3/2019 |
| TW | I654750 | 3/2019 |
| TW | M605971 | 1/2021 |

* cited by examiner

FIG. 3

FINGERPRINT SENSING SYSTEM AND OPERATION METHOD THEREOF

CROSS-REFERENCE TO RELATED APPLICATION

This application claims the priority benefit of U.S. provisional application No. 62/946,431, filed on Dec. 11, 2019, and China application no. 202010620318.5, filed on Jul. 1, 2020. The entirety of each of the above-mentioned patent applications is hereby incorporated by reference herein and made a part of this specification.

TECHNICAL FIELD

The invention relates to a sensing system and an operation method thereof, and more particularly, to a fingerprint sensing system and an operation method thereof.

BACKGROUND

Due to the development of smart phones and mobile devices, and people's requirements for the security of these devices, the demand for fingerprint sensing systems has increased significantly. In general, the fingerprint sensing system includes a sensor, a shielding structure, and a lens array. When a sensing beam hits the user's finger, a reflected beam will pass through the lens array, the shielding structure and the sensor in sequence. Signals output by the sensor form a fingerprint image.

In order to obtain a good fingerprint image, an opening in the shielding structure is preferably aligned with a sensing pixel of the sensor. Since the sensor and the shielding structure can be formed sequentially in the semiconductor manufacturing process, the opening in the shielding structure can be aligned with the sensing pixel of the sensor.

However, the lens array cannot be easily formed in the semiconductor manufacturing process, it is difficult for a lens optical axis of the lens array to be aligned with the opening in the shielding structure and the sensing pixel of the sensor. Therefore, a reliability of the fingerprint image obtained by the fingerprint sensing system cannot be improved.

SUMMARY

The invention provides a fingerprint sensing system and an operation method thereof, which can improve the reliability of the fingerprint image obtained by the fingerprint sensing system.

A fingerprint sensing system in an embodiment of the invention includes a plurality of micro-lenses, a sensor, a shielding structure and a controller. The micro-lenses are arranged in an array. The sensor has a plurality of sensing pixels arranged in an array. The sensor, the shielding structure and the micro-lenses are sequentially arranged along an arrangement direction. The controller is electrically connected to the sensor. A pitch between the micro-lenses is greater than a pitch between the sensing pixels. The controller forms a fingerprint image according to signals of a plurality of output pixels of the sensor, wherein each of the output pixels is one of every at least four of neighboring sensing pixels.

The operation method of a fingerprint sensing system in an embodiment of the invention includes: for every at least four of neighboring sensing pixels of a plurality of sensing pixels, selecting one of every at least four of the neighboring sensing pixels as an output pixel; performing a calibration process on signals of the output pixels; and obtaining calibrated signals of the output pixels to form a fingerprint image.

Based on the above, according to the fingerprint sensing system and the operation method thereof in the embodiment of the invention, since the output pixel may be one of every at least four of the neighboring sensing pixels, as long as the position of the output pixel is properly selected, a signal-to-noise ratio of the fingerprint image can be increased so that the reliability of the fingerprint sensing system and the operation method thereof is higher.

DETAILED DESCRIPTION

Figure 1A:
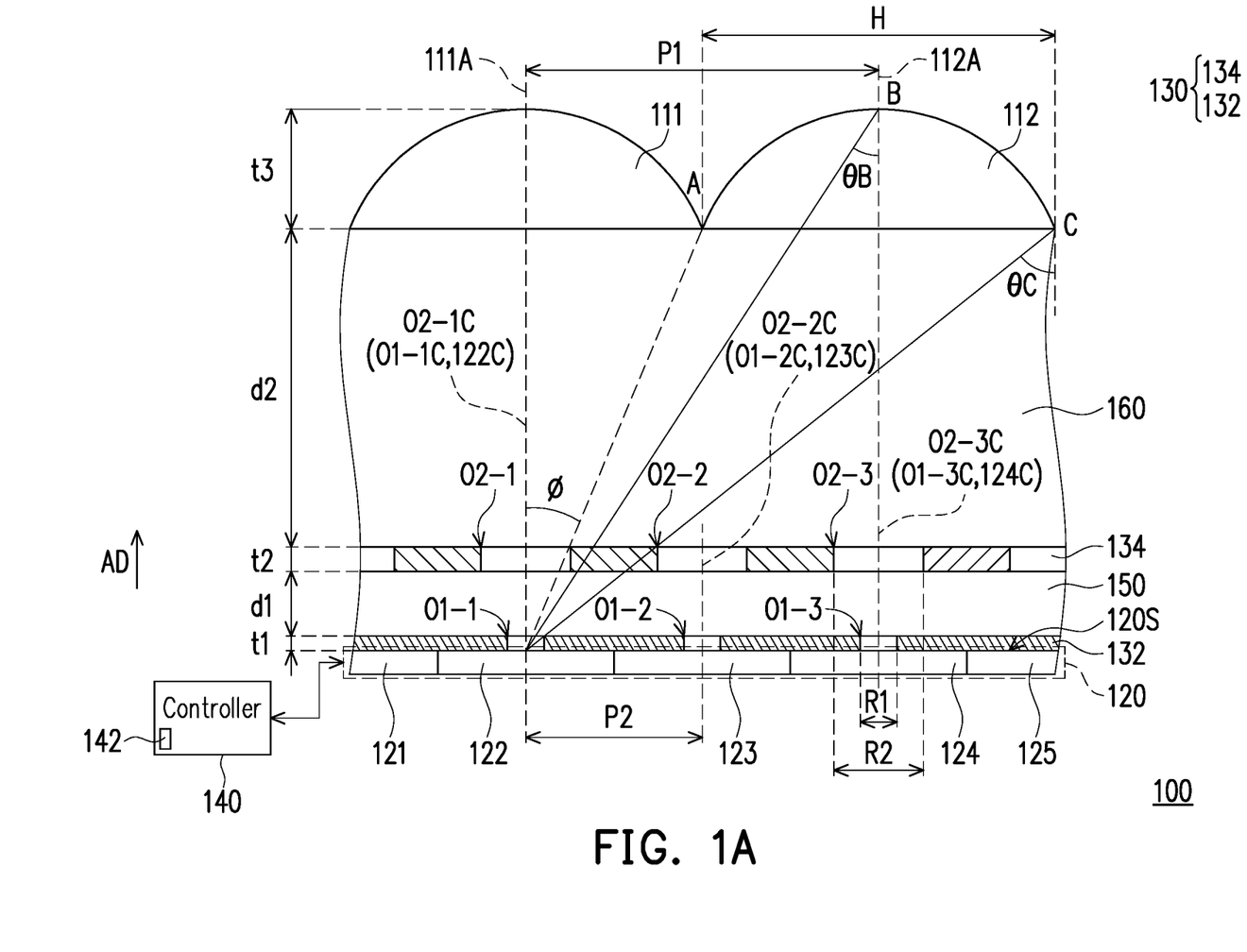
FIG. 1A is a cross-sectional view of a fingerprint sensing system according to an embodiment of the invention.

FIG. 1A is a cross-sectional view of a fingerprint sensing system according to an embodiment of the invention. Referring to FIG. 1A, a fingerprint sensing system 100 in an embodiment of the invention includes a plurality of micro-lenses 111 and 112, a sensor 120, a shielding structure 130 and a controller 140. Further, the sensor 120 may be a light sensor of thin film transistor (TFT), complementary metal oxide semiconductor (CMOS) or charge coupled device (CCD). The sensor 120 is configured to receive a light beam reflected from a finger, so that the fingerprint sensing system 100 can obtain a fingerprint image. In addition, the shielding structure 130 may be a metal layer formed by a lithography process.

In this embodiment, the micro-lenses 111 and 112 are arranged in an array. A maximum width H of the micro-lenses 111 and 112 perpendicular to an arrangement direction AD is equal to a pitch P1 between the micro-lenses 111 and 112. The width H is, for example, a distance from a position A to a position C in FIG. 1A. The sensor 120 has a plurality of sensing pixels 121, 122, 123, 124 and 125 arranged in an array. The pitch P1 between the micro-lenses 111 and 112 is greater than a pitch P2 between the sensing pixels 121, 122, 123, 124 and 125. In addition, the sensor 120, the shielding structure 130 and the micro-lenses 111 and 112 are sequentially arranged along the arrangement direction AD.

In this embodiment, the shielding structure 130 includes a first shielding structure 132 and a second shielding structure 134. Here, the first shielding structure 132 is disposed above a sensing surface 120S of the sensor 120, and the first shielding structure 132 is disposed between the second shielding structure 134 and the sensor 120 in the arrangement direction AD. Furthermore, the first shielding structure 132 has a plurality of first openings O1-1, O1-2 and O1-3, and a center line (O1-1C, O1-2C, O1-3C) of each of the first openings O1-1, O1-2 and O1-3 in the arrangement direction AD coincides with a center line (122C, 123C, 124C) of one of the sensing pixels 122, 123 and 124 in the arrangement direction AD. The second shielding structure 134 has a plurality of second openings O2-1, O2-2 and O2-3, and a center line (O2-1C, O2-2C, O2-3C) of each of the second openings O2-1, O2-2 and O2-3 in the arrangement direction AD coincides with the center line (O1-1C, O1-2C, O1-3C) of one of the first openings O1-1, O1-2 and O1-3 in the arrangement direction AD. For example, in FIG. 1A, the center line O2-1C of the second opening O2-1 coincides with the center line O1-1C of the first opening O1-1 and the center line 122C of the sensing pixel 122 for light to enter the sensing pixel 122; the center line O2-2C of the second opening O2-2 coincides with the center line O1-2C of the first opening O1-2 and the center line 123C of the sensing pixel 123 for light to enter the sensing pixel 123; the center line O2-3C of the second opening O2-3 coincides with the center line O1-3C of the first opening O1-3 and the center line 124C of the sensing pixel 124 for light to enter the sensing pixel 124.

In this embodiment, the fingerprint sensing system 100 further includes a first light-transmitting structure 150 and a second light-transmitting structure 160. Materials of the first light-transmitting structure 150 and the second light-transmitting structure 160 may be light-transmitting and insulating materials.

In this embodiment, the fingerprint sensing system 100 further includes the controller 140. The controller 140 is electrically connected to the sensor 120. The controller 140 includes, for example, a microcontroller unit (MCU), a central processing unit (CPU), a microprocessor, a digital signal processor (DSP), a programmable controller, a programmable logic device (PLD) or other similar devices or a combination of the above devices, which are not particularly limited by the invention. Further, in an embodiment, various functions of the controller 140 may be implemented as a plurality of program codes. These program codes will be stored in a memory 142 so the program codes executed by the processor 140 later. Alternatively, in an embodiment, various functions of the controller 140 may be implemented as one or more circuits. The invention is not intended to limit whether various functions of the controller 140 are implemented by ways of software or hardware.

Figure 1B:
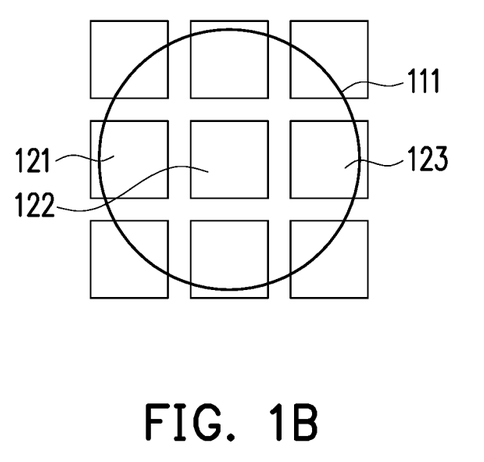
FIG. 1B is a schematic diagram illustrating relative positions of micro-lenses and sensing pixels of FIG. 1A along an arrangement direction.

FIG. 1A illustrates a preferred situation in which the micro-lenses 111 and 112 of the fingerprint sensing system 100 are aligned with other elements in the fingerprint sensing system 100 in the arrangement direction. FIG. 1B is a schematic diagram illustrating relative positions of micro-lenses and sensing pixels of FIG. 1A along an arrangement direction. Referring to FIG. 1A and FIG. 1B together, specifically, the micro-lens 111 completely overlaps with the first opening O1-1 of the first shielding structure 132, the second opening O2-1 of the second shielding structure 134 and the sensing pixel 122 in the arrangement direction AD. The micro-lens 112 completely overlaps with the first opening O1-3 of the first shielding structure 132, the second opening O2-3 of the second shielding structure 134, and the sensing pixel 124 in the arrangement direction AD. In a more preferred embodiment, an optical axis 111A of the micro-lens 111 substantially coincides with the center line O2-1C of the second opening O2-1, the center line O1-1C of the first opening O1-1 and the center line 122C of the sensing pixel 122, and an optical axis 112A of the micro-lens 112 substantially coincides with the center line O2-3C of the second opening O2-3, the center line O1-3C of the first opening O1-3 and the center line 124C of the sensing pixel 124.

In this embodiment, every at least four of neighboring sensing pixels of the sensor 120 at least partially overlap with one of the micro-lenses 111 and 112 in the arrangement direction AD. Taking FIG. 1B as an example, the sensing pixels 121, 122, and 123 and the other six sensing pixels partially overlap with the micro-lens 111 in the arrangement direction AD. By analogy, the sensing pixels 123, 124 and 125 of FIG. 1A and the other six sensing pixels partially overlap with the micro-lens 112 in the arrangement direction AD. In an embodiment, every at least four of the neighboring sensing pixels of the sensor 120 may completely overlap with one of the micro-lenses 111 and 112 in the arrangement direction AD.

In this embodiment, the controller 140 forms a fingerprint image according to signals of a plurality of output pixels of the sensor 120, wherein each of the output pixels is one of every at least four of the neighboring sensing pixels. Preferably, the output pixel is the sensing pixel closest to the optical axis (111A, 112A) of the micro-lens (111, 112) in every at least four of the neighboring sensing pixels. Taking FIG. 1A as an example, when the center lines 122C and 124C of the sensing pixels 122 and 124 are aligned with the optical axis 111A of the micro-lens 111 and the optical axis 112A of the micro-lens 112, respectively, the sensing pixel 122 and the sensing pixel 124 may receive the signal with higher intensity compared to their neighboring sensing pixels. Therefore, by selecting the sensing pixels 122 and 124 as the output pixels, the signal-to-noise ratio of the fingerprint image can be increased so the reliability of the fingerprint sensing system 100 is higher.

In an embodiment, the controller 140 selects the output pixel from every at least four of the neighboring sensing pixels according to a lookup table. Here, the lookup table may be pre-stored in the memory 142 of the controller 140. The lookup table includes a position of the output pixel from every at least four of the neighboring sensing pixels and a calibration value of the output pixel. For instance, the position of each output pixel can be a row and a column of the respective output pixel in a sensing pixel array. The calibration value of the output pixel may be a parameter or a value calculated through an algorithm and used to adjust original data of the output pixel by the fingerprint sensing system 100 using a calibrator. For example, the signals obtained from the sensing pixels 121, 123 and 125 not selected as the output pixel are calculated by the algorithm and served as noise values of the sensing pixels 122 and 124.

In this embodiment, the fingerprint sensing system 100 meets following conditional formula:

$$2 \times (t1+d1+t2) \times \tan \theta B > R2 \geq 2 \times (t1+d1+t2) \times \tan \phi, \quad (1)$$

wherein $$\phi = \tan^{-1}((P1/2)/(t_{total})),$$

$$\theta B = \tan^{-1}(P1/(t3+t_{total})),$$

$$t_{total} = t1+d1+t2+d2,$$

d1 is a distance between the first shielding structure 132 and the second shielding structure 134, d2 is a distance between the second shielding structure 134 and the micro-lenses 111 and 112, t1 is a thickness of the first shielding structure 132 in the arrangement direction AD, t2 is a thickness of the second shielding structure 134 in the arrangement direction AD, t3 is a maximum thickness of the micro-lenses 111 and 112 in the arrangement direction AD, R2 is a diameter of the second openings O2-1, O2-2 and O2-3 of the second shielding structure 134, and P1 is a pitch between the micro-lenses 111 and 112. Due to the stray light, the signal-to-noise ratio of the fingerprint image is reduced, which affects the reliability of the fingerprint sensing system 100. For example, the light passing through the micro-lens 111 is received by the output pixel corresponding to the micro-lens 112 (the sensing pixel 124 of FIG. 1A) to form the stray light. Similarly, the light passing through the micro-lens 112 is received by the output pixel corresponding to the micro-lens 111 (the sensing pixel 122 of FIG. 1A) to form the stray light. When the fingerprint sensing system 100 meets the formula (1), each output pixel of the fingerprint sensing system 100 (the sensing pixels 122 and 124 in FIG. 1A) can effectively avoid stray light. Therefore, the reliability of the fingerprint sensing system 100 is higher.

In this embodiment, the fingerprint sensing system 100 meets following conditional formula:

$$(t1+d1+t2) \times \tan\theta C < P2 < 2 \times (t1+d1+t2) \times \tan\theta C, \quad (2)$$

wherein $$\theta C = \tan^{-1}((1.5 \times P1)/(t_{total}))$$

$$t_{total} = t1 + d1 + t2 + d2,$$

and P2 is the pitch between the sensing pixels 121, 122, 123, 124 and 125. When the fingerprint sensing system 100 meets the formula (2), each output pixel of the fingerprint sensing system 100 (the sensing pixels 122 and 124 in FIG. 1A) can effectively avoid stray light. Therefore, the reliability of the fingerprint sensing system 100 is higher.

In this embodiment, the fingerprint sensing system meets following conditional formula:

$$d1 > R1, \quad (3)$$

wherein R1 is a diameter of the first openings O1-1, O1-2 and O1-3 of the first shielding structure 132. When the fingerprint sensing system 100 meets the formula (3), each output pixel of the fingerprint sensing system 100 (the sensing pixels 122 and 124 in FIG. 1A) can effectively avoid stray light. Therefore, the reliability of the fingerprint sensing system 100 is higher.

Based on the above, according to the fingerprint sensing system 100 in the embodiment of the invention, since the pitch between the micro-lenses of the fingerprint sensing system 100 is greater than the pitch between the sensing pixels and the output pixel may be one of every at least four of the neighboring sensing pixels, as long as the position of the output pixel is properly selected, the signal-to-noise ratio of the fingerprint image can be increased so that the reliability of the fingerprint sensing system 100 is higher. Furthermore, when the fingerprint sensing system 100 meets the formula (1) to the formula (3), each output pixel of the fingerprint sensing system 100 can effectively avoid stray light. Therefore, the reliability of the fingerprint sensing system 100 is higher.

Figure 2A:
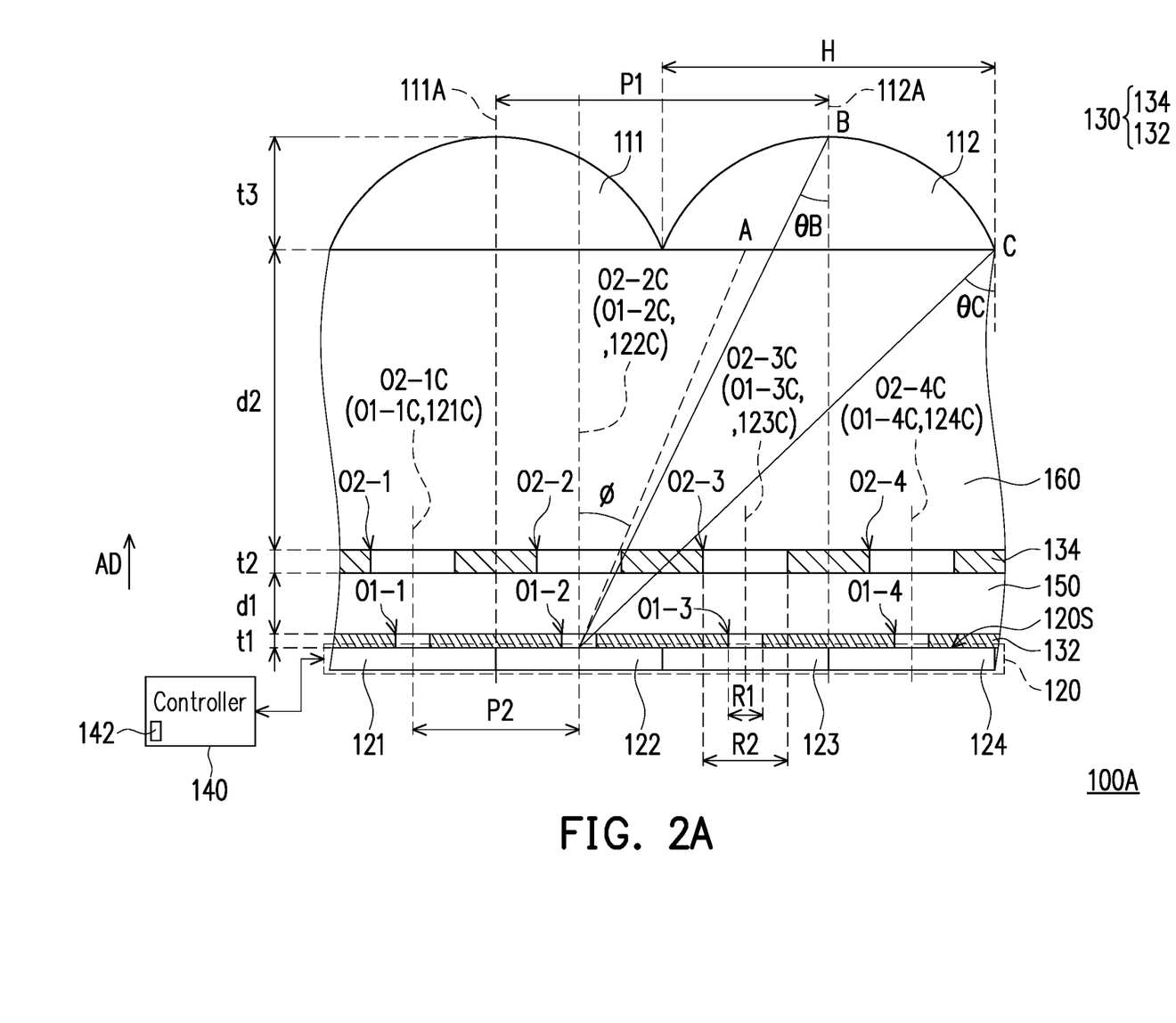
FIG. 2A is a cross-sectional view of a fingerprint sensing system according to another embodiment of the invention.
Figure 2B:
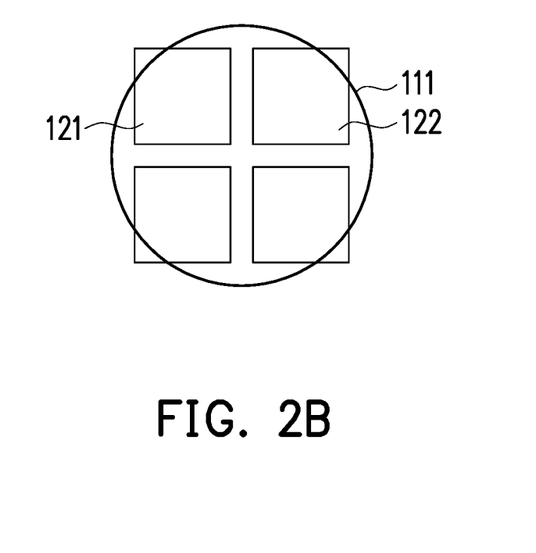
FIG. 2B is a schematic diagram illustrating relative positions of micro-lenses and sensing pixels of FIG. 2A along an arrangement direction.

FIG. 2A is a cross-sectional view of a fingerprint sensing system according to another embodiment of the invention. FIG. 2B is a schematic diagram illustrating relative positions of micro-lenses and sensing pixels of FIG. 2A along an arrangement direction. Referring to FIG. 2A and FIG. 2B together, a fingerprint sensing system 100A of FIG. 2A is similar to the fingerprint sensing system 100 of FIG. 1A and the main differences between them are: FIG. 2A illustrates a situation in which the micro-lenses 111 and 112 of the fingerprint sensing system 100A are not preferably aligned with other elements in the fingerprint sensing system 100A in the arrangement direction AD.

In detail, the micro-lens 111 of this embodiment completely overlaps with the first openings O1-1 and O1-2 of the first shielding structure 132 and the second openings O2-1 and O2-2 of the second shielding structure 134 and the sensing pixels 121 and 122 in the arrangement direction AD. The micro-lens 112 completely overlaps with the first openings O1-3 and O1-4 of the first shielding structure 132, the second opening O2-3 and O2-4 of the second shielding structure 134 and the sensing pixels 123 and 124 in the arrangement direction AD. In this embodiment, the optical axis 111A of the micro-lens 111 is parallel to, but does not coincide with, the center lines O2-1C and O2-2C of the second openings O2-1 and O2-2, the center lines O1-1C and O1-2C of the first openings O1-1 and O1-2 and the center lines 121C and 122C of the sensing pixel 121 and 122, and the optical axis 112A of the micro-lens 112 is parallel to, but does not coincide with, the center lines O2-3C and O2-4C of the second openings O2-3 and O2-4, the center lines O1-3C and O1-4C of the first openings O1-3 and O1-4 and the center lines 123C and 124C of the sensing pixel 123 and 124.

Further, in this embodiment, taking FIG. 2B as an example, the sensing pixels 121 and 122 and the other two sensing pixels partially overlap with the micro-lens 111 in the arrangement direction AD. By analogy, the sensing pixels 123 and 124 of FIG. 2A and the other two sensing pixels partially overlap with the micro-lens 112 in the arrangement direction AD.

In addition, since a uniform light source is incident on the fingerprint sensing system 100A, each of the sensing pixels 121, 122, 123 and 124 can receive signals with similar intensity. In this embodiment, one of the four sensing pixels that partially overlap with the micro-lens 111 in the arrangement direction AD may be selected as the output pixel, and one of the four sensing pixels that partially overlap with the micro-lens 112 in the arrangement direction AD may be selected as another output pixel. For example, the sensing pixels 121 and 123 are selected as the output pixels. Further, the signals obtained from the rest of the sensing pixels 122 and 124 not selected as the output pixel are calculated through the algorithm and served as noise values of the sensing pixels 121 and 123.

Moreover, in this embodiment, the fingerprint sensing system 100A meets following conditional formula:

$$2 \times (t1+d1+t2) \times \tan\theta B' > R2 \geq 2 \times (t1+d1+t2) \times \tan\phi, \quad (4)$$

wherein $$\theta B' = \tan^{-1}(0.75 \times P1/(t3+t_{total})).$$

When the fingerprint sensing system 100A meets the conditional formula (4), each output pixel of the fingerprint sensing system 100A (the sensing pixels 121 and 123 in FIG. 2A) can effectively avoid stray light. Therefore, the reliability of the fingerprint sensing system 100A is higher.

Moreover, in this embodiment, the fingerprint sensing system 100A meets following conditional formula:

$$(t1+d1+t2) \times \tan\theta C' < P2 < 2 \times (t1+d1+t2) \times \tan\theta C', \quad (5)$$

wherein $$\theta C' = \tan^{-1}((1.25 \times P1)/(t_{total})).$$

When the fingerprint sensing system 100A meets the conditional formula (5), each output pixel of the fingerprint sensing system 100A (the sensing pixels 121 and 123 in FIG. 2A) can effectively avoid stray light. Therefore, the reliability of the fingerprint sensing system 100A is higher.

Figure 3:
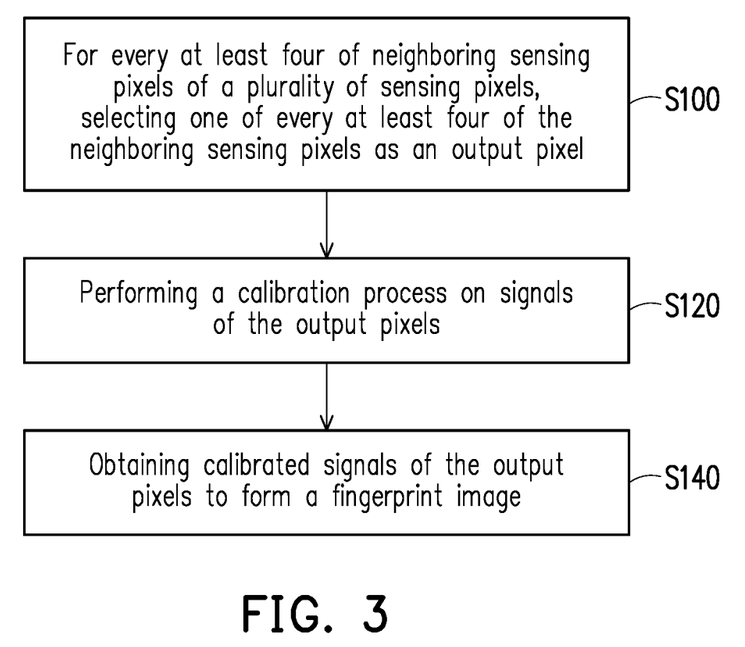
FIG. 3 is a flowchart of an operation method of a fingerprint sensing system according to an embodiment of the invention.

FIG. 3 is a flowchart of an operation method of a fingerprint sensing system according to an embodiment of the invention. Referring to FIG. 3, the operation method of the fingerprint sensing system (100, 100A) in an embodiment of the invention includes the following steps. In step S100, for every at least four of neighboring sensing pixels of a plurality of sensing pixels 121, 122, 123, 124 and 125, one of every at least four of the neighboring sensing pixels is selected as an output pixel. In step S120, a calibration process is performed on signals of the output pixels. In step S140, calibrated signals of the output pixels are obtained to form a fingerprint image.

In detail, the fingerprint sensing systems 100 and 100A may be under-screen fingerprint sensing systems. The fingerprint sensing systems 100 and 100A may be arranged under a display. Before the fingerprint sensing systems 100 and 100A are shipped from the factory, a calibrator is used to determine which one of every at least four of the neighboring sensing pixels should be selected as the output pixel in the fingerprint sensing systems 100 and 100A. In this embodiment, the calibrator is, for example, a white, black, or other flat plate with good reflectivity. In an embodiment, the calibrator may have a designed pattern or mark, such as black and white spaced stripes that simulate a fingerprint. Next, the display emits a light beam and irradiates the calibrator. The light beam reflected by the calibrator sequentially passes through the micro-lenses 111 and 112, the second shielding structure 134 and the first shielding structure 132 to be received by the sensing pixels 121, 122, 123, 124 and 125.

For example, if the calibrator is the white flat plate, the output pixels is preferably to be a received signal with a highest intensity in every at least four of the neighboring sensing pixels. Taking FIG. 1A as an example, the fingerprint sensing system 100 may select the sensing pixels 122 and 124 as the output pixels. Furthermore, when the sensing pixels in every at least four of the neighboring sensing pixels receives the signals with similar intensity, the controller 140 may arbitrarily select one of every at least four of the neighboring sensing pixels as the output pixel. Taking FIG. 2A as an example, the controller 140 may select the sensing pixels 121 and 123 as the output pixels. However, the invention is not limited in this regard. In an embodiment, for example, the calibrator uses a black platform. Accordingly, the controller 140 may select one with a weakest received signal in every at least four of the neighboring sensing pixels as the output pixel. In another embodiment, for example, the calibrator has the black and white spaced stripes. In this case, the output pixels of the fingerprint sensing system 100 and 100A should be selected according to a pattern on the calibrator. That is to say, when every at least four of the neighboring sensing pixels corresponds to a black stripe, one having a received signal with lower intensity should be selected as the output pixel. Conversely, when every at least four of the neighboring sensing pixels corresponds to a white portion of the black and white spaced stripes, one having a received signal with higher intensity should be selected as the output pixel.

In one embodiment, the operation method of the fingerprint sensing system (100, 100A) uses a local selection algorithm to calculate the position of the output pixel. In an embodiment, the local selection algorithm is based on the formula (1) to the formula (5), parameters of each element in the fingerprint sensing systems 100 and 100A (e.g., the pitches P1 and P2, the diameters R1 and R2, thicknesses t1, t2 and t3 and the width H), a local maximum selection, a local minimum selection, a noise reduction strength and a pattern selection threshold.

In one embodiment, the operation method of the fingerprint sensing system (100, 100A) further uses the local selection algorithm to calculate the calibration value of the output pixel. In an embodiment, the local selection algorithm may include a noise reduction algorithm. The noise reduction algorithm includes a pixel binning, a frame average, and a low-pass filter. In the pixel binning, for example, signals obtained by pixel binning of the sensing pixels not selected as the output pixel in every at least four of the neighboring sensing pixels are considered as noise; or, a specific ratio of signal values obtained by the sensing pixels not selected as the output pixel in every at least four of the neighboring sensing pixels is added to a signal value of the output pixel. The specific ratio is, for example, 1% to 10%. In the frame average, for example, signals obtained from the sensing pixels 121, 122, 123, 124 and 125 in time are averaged to reduce noise values in time. In addition, the low-pass filter is, for example, the signal obtained by the sensing pixels 121, 122, 123, 124 and 125 to remove the signal in the high-frequency part in time.

Furthermore, the controller 140 records the position of each output pixel. In an embodiment, the position of the output pixel is pre-recorded in the lookup table. In another embodiment, the lookup table may be stored in the memory 142 of the controller 140.

In an embodiment, the operation method of the fingerprint sensing system (100, 100A) further records each of the parameters obtained by the noise reduction algorithm in correspondence to the position of the output pixel in the lookup table as the calibration value of each output pixel. Therefore, after leaving the factory, the controller 140 may perform the calibration process on the signals of the output pixels through the calibration value in the lookup table (i.e., step S120).

In summary, according to the fingerprint sensing system and the operation method thereof in the embodiment of the invention, since the pitch between the micro-lenses of the fingerprint sensing system is greater than the pitch between the sensing pixels and the output pixel may be one of every at least four of the neighboring sensing pixels, as long as the position of the output pixel is properly selected, the signal-to-noise ratio of the fingerprint image can be increased so that the reliability of the fingerprint sensing system and the operation method thereof is higher.

The invention claimed is:

1. A fingerprint sensing system, comprising:
    a plurality of micro-lenses, arranged in an array;
    a sensor, having a plurality of sensing pixels arranged in an array;
    a shielding structure, wherein the sensor, the shielding structure and the micro-lenses are sequentially arranged along an arrangement direction; and
    a controller, electrically connected to the sensor; wherein
    a pitch between the micro-lenses is greater than a pitch between the sensing pixels;
    the controller forms a fingerprint image according to signals of a plurality of output pixels of the sensor, wherein each of the output pixels is one of every at least four of neighboring sensing pixels,
    wherein the controller uses sensing pixels that are not selected as output pixel among the every at least four of neighboring sensing pixels as noise value of the each of the output pixels.

2. The fingerprint sensing system of claim 1, wherein every at least four of the neighboring sensing pixels at least partially overlap with one of the micro-lenses in the arrangement direction.

3. The fingerprint sensing system of claim 1, wherein each of the output pixels is a received signal with a highest intensity in every at least four of the neighboring sensing pixels.

4. The fingerprint sensing system of claim 1, wherein the controller selects the output pixel from every at least four of the neighboring sensing pixels according to a lookup table, and the lookup table comprises a position of the output pixel from every at least four of the neighboring sensing pixels and a calibration value of the output pixel.

5. The fingerprint sensing system of claim 1, wherein the shielding structure comprises:
   a first shielding structure; and
   a second shielding structure, wherein the first shielding structure is disposed between the second shielding structure and the sensor in the arrangement direction.

6. The fingerprint sensing system of claim 5, wherein the first shielding structure has a plurality of first openings, and a center line of each of the first openings in the arrangement direction coincides with a center line of one of the sensing pixels in the arrangement direction.

7. The fingerprint sensing system of claim 6, wherein the second shielding structure has a plurality of second openings, and a center line of each of the second openings in the arrangement direction coincides with the center line of one of the first openings in the arrangement direction.

8. The fingerprint sensing system of claim 7, wherein a maximum width of the micro-lenses perpendicular to the arrangement direction is equal to the pitch between the micro-lenses.

9. The fingerprint sensing system of claim 7, wherein the fingerprint sensing system meets following conditional formula:

$$2\times(t1+d1+t2)\times\tan\theta B > R2 \geq 2\times(t1+d1+t2)\times\tan\phi,$$

wherein $$\phi=\tan^{-1}((P1/2)/(t_{total})),$$

$$\theta B=\tan^{-1}(P1/(t3+t_{total})),$$

$$t_{total}=t1+d1+t2+d2,$$

d1 is a distance between the first shielding structure and the second shielding structure, d2 is a distance between the second shielding structure and the micro-lenses, t1 is a thickness of the first shielding structure in the arrangement direction, t2 is a thickness of the second shielding structure in the arrangement direction, t3 is a maximum thickness of the micro-lenses in the arrangement direction, R2 is a diameter of the second openings of the second shielding structure, and P1 is the pitch between the micro-lenses.

10. The fingerprint sensing system of claim 7,
wherein the fingerprint sensing system meets following conditional formula:

$$(t1+d1+t2)\times\tan\theta C < P2 < 2\times(t1+d1+t2)\times\tan\theta C,$$

wherein $$\theta C=\tan^{-1}((1.5\times P1)/(t_{total})),$$

$$t_{total}=t1+d1+t2+d2,$$

P1 is the pitch between the micro-lenses, P2 is the pitch between the sensing pixels, d1 is a distance between the first shielding structure and the second shielding structure, d2 is a distance between the second shielding structure and the micro-lenses, t1 is a thickness of the first shielding structure in the arrangement direction, and t2 is a thickness of the second shielding structure in the arrangement direction.

11. The fingerprint sensing system of claim 7, wherein the fingerprint sensing system meets following conditional formula:

$$d1 > R1,$$

wherein d1 is a distance between the first shielding structure and the second shielding structure, and R1 is a diameter of the first openings of the first shielding structure.

12. The fingerprint sensing system of claim 7, wherein the fingerprint sensing system meets following conditional formula:

$$2\times(t1+d1+t2)\times\tan\theta B' > R2 \geq 2\times(t1+d1+t2)\times\tan\phi,$$

wherein $$\phi=\tan^{-1}((P1/2)/(t_{total})),$$

$$\theta B'=\tan^{-1}(0.75\times P1/(t3+t_{total})),$$

$$t_{total}=t1+d1+t2+d2,$$

d1 is a distance between the first shielding structure and the second shielding structure, d2 is a distance between the second shielding structure and the micro-lenses, t1 is a thickness of the first shielding structure in the arrangement direction, t2 is a thickness of the second shielding structure in the arrangement direction, t3 is a maximum thickness of the micro-lenses in the arrangement direction, R2 is a diameter of the second openings of the second shielding structure, and P1 is the pitch between the micro-lenses.

13. The fingerprint sensing system of claim 7,
wherein the fingerprint sensing system meets following conditional formula:

$$(t1+d1+t2)\times\tan\theta C' < P2 < 2\times(t1+d1+t2)\times\tan\theta C',$$

wherein $$\theta C'=\tan^{-1}((1.25\times P1)/(t_{total})),$$

$$t_{total}=t1+d1+t2+d2,$$

P1 is the pitch between the micro-lenses, P2 is the pitch between the sensing pixels, d1 is a distance between the first shielding structure and the second shielding structure, d2 is a distance between the second shielding structure and the micro-lenses, t1 is a thickness of the first shielding structure in the arrangement direction, and t2 is a thickness of the second shielding structure in the arrangement direction.

14. An operation method of a fingerprint sensing system, comprising:
   for every at least four of neighboring sensing pixels of a plurality of sensing pixels, selecting one of every at least four of the neighboring sensing pixels as an output pixel;
   performing a calibration process on signals of the output pixels;
   obtaining calibrated signals of the output pixels to form a fingerprint image; and taking sensing pixels that are not selected as the output pixel among the every at least four of neighboring sensing pixels as a noise value of the output pixel.

15. The operation method of claim 14, wherein a controller of the fingerprint sensing system selects the output pixel according to a pattern on a calibrator.

16. The operation method of claim 15, wherein the output pixel is a received signal with a highest intensity in every at least four of the neighboring sensing pixels.

17. The operation method of claim 15, wherein the controller stores a lookup table, and the lookup table comprises a position and a calibration value of the output pixel.

18. The operation method of claim 17, wherein a calculating method of the position and the calibration value of the output pixel is a local selection algorithm.

19. The operation method of claim 18, wherein the local selection algorithm comprises a local maximum selection, a local minimum selection, a noise reduction strength, a pattern selection threshold, a pixel binning, a frame average and a low-pass filter.

20. The operation method of claim 17, wherein the calibration value of each of the output pixels is obtained by calculating the signals of the sensing pixels not selected as the output pixel in every at least four of the neighboring sensing pixels.

* * * * *